United States Patent [19]

Rosen et al.

[11] Patent Number: 4,805,084
[45] Date of Patent: Feb. 14, 1989

[54] DIRECT DC TO RF CONVERSION BY IMPULSE EXCITATION

[75] Inventors: Arye Rosen, Camden, N.J.; Chi H. Lee, Potomac, Md.

[73] Assignee: General Electric Company, Schenectady, N.Y.

[21] Appl. No.: 185,561

[22] Filed: Apr. 25, 1988

[51] Int. Cl.$^4$ ............................................ H02M 1/00
[52] U.S. Cl. ........................................ 363/147; 363/8;
372/92; 333/195; 333/204; 333/219; 357/30
[58] Field of Search ........................ 363/8, 147, 157;
372/92; 333/161, 193–195, 204, 205, 219;
357/30 D, 30 G, 30 P

[56] References Cited

U.S. PATENT DOCUMENTS

| | | | |
|---|---|---|---|
| 3,229,106 | 1/1966 | Lord et al. | 363/157 |
| 4,297,661 | 10/1981 | Stegens | 333/204 |
| 4,403,239 | 9/1983 | Yamazaki | 357/30 D |
| 4,583,064 | 5/1986 | Makimoto et al. | 333/219 |
| 4,743,874 | 5/1988 | Kinoshita et al. | 333/219 |
| 4,764,933 | 8/1988 | Kozlovsky et al. | 372/92 |

OTHER PUBLICATIONS

J. M. Proud, Jr. et al., "High–Frequency Waveform Generation Using Optoelectronic Switching in Silicon," IEEE Trans. Microwave Theory Tech., vol. MTT-26, No. 3, Mar. 1978, pp. 137–140.
C. S. Chang et al., "Direct DC to RF Conversion by a Picosecond Optoelectronic Switching", IEEE MTT-S Internation Microwave Symposium Digest, 1984, pp. 540–541.
G. A. Mourou et al., "Picosecond Electronics and Optoelectronics", Springer-Verlag, pp. 216–218, "Direct DC to RF Conversion by Impulse Excitation of a Resonant Cavity".
P. J. Stabile et al., "Optically Controlled Lateral PIN Diodes and Microwave Control Circuits", RCA Review, vol. 47, 12/86, pp. 443–456.

Primary Examiner—Peter S. Wong
Attorney, Agent, or Firm—Henry I. Steckler; James C. Davis, Jr.; Paul R. Webb, II

[57] ABSTRACT

A device for converting DC to RF has a monolithic PIN diode adapted to be coupled to a DC supply. The diode receives light switching pulses and is coupled to a monolithic resonator. The monolithic form provides compactness and reliability, while the diode, which is reversed biased when OFF, prevents substrate leakage currents. The diode and the resonator can be made in a single substrate, e.g., silicon, or in different substrates, e.g., silicon for the diode to obtain a long carrier lifetime and, thus, minimize the light pulse repetition rate, and GaAs for the resonator to obtain a high Q. The resonator can also act as an impedance transformer.

18 Claims, 1 Drawing Sheet

DIRECT DC TO RF CONVERSION BY IMPULSE EXCITATION

BACKGROUND OF THE INVENTION

The present invention relates to converting DC (direct current) to RF (radio frequency), and more particularly, using a monolithic optical switch to impulse excite a monolithic resonator.

It is known to use an optical switch coupled to a DC supply in order to inexpensively generate high power microwave and millimeter wave signals. Indeed, above about 200 GHz such an arrangement is probably the only practical way of generating signals, except possibly for mixing the signals from two lasers together and selecting the difference frequency signal, since about 200 GHz is the limit for conventional oscillators. In particular, such an arrangement provides such high sub-millimeter wave signals due to the very fast switching time, e.g., one picosecond or less, of the optical switch, which results in harmonics in the sub-millimeter range.

Such arrangements are shown in the articles "High-Frequency Waveform Generation Using Optoelectronic Switching in Silicon" by M. M. Proud, Jr. and S. L. Norman, I.E.E.E. Trans. Microwave Theory Tech., MTT-26, pp. 137-140, 1978, and "Direct DC to RF Conversion by Picosecond Optoelectronic Switching", by C. S. Chang et al., IEEE MTT-S International Microwave Symposium Digest, 1984, pp. 540-541, wherein the optical switch comprises bulk silicon and the later article shows a resonator comprising a cavity, which is bulky. Further, the bulk silicon or other semiconductor must have a high OFF resistance in order to withstand the applied high DC voltage. However, it is then difficult to make a good ohmic contact to the bulk silicon resulting in a high ON resistance, and therefore low efficiency and eventual burn out of the switch due to the heat dissipation thereof. One can make such an arrangement in monolithic form to reduce the size thereof, but the other above-mentioned problems remain. Further, it is normally desirable to have a plurality of such arrangements in monolithic form in order to, e.g., form a phased array. It has been found that using a bulk semiconductor optical switch causes unwanted coupling between the DC to RF converters and interference to the optically triggered timing thereof.

It is, therefore, desirable to have a DC to RF converter that is efficient, reliable, and a plurality of which can be made in monolithic form without undesired coupling therebetween.

SUMMARY OF THE INVENTION

A device for converting voltage from a DC supply to RF comprises a monolithic resonator, and a monolithic lateral PIN diode optical switch means having a pair of opposite conductivity type regions adapted to be coupled to the DC supply, one of said regions coupled to said resonator, and an intrinsic region adapted to receive an optical switching signal.

DETAILED DESCRIPTION OF THE PREFERRED EMBODIMENTS

Figure 1:
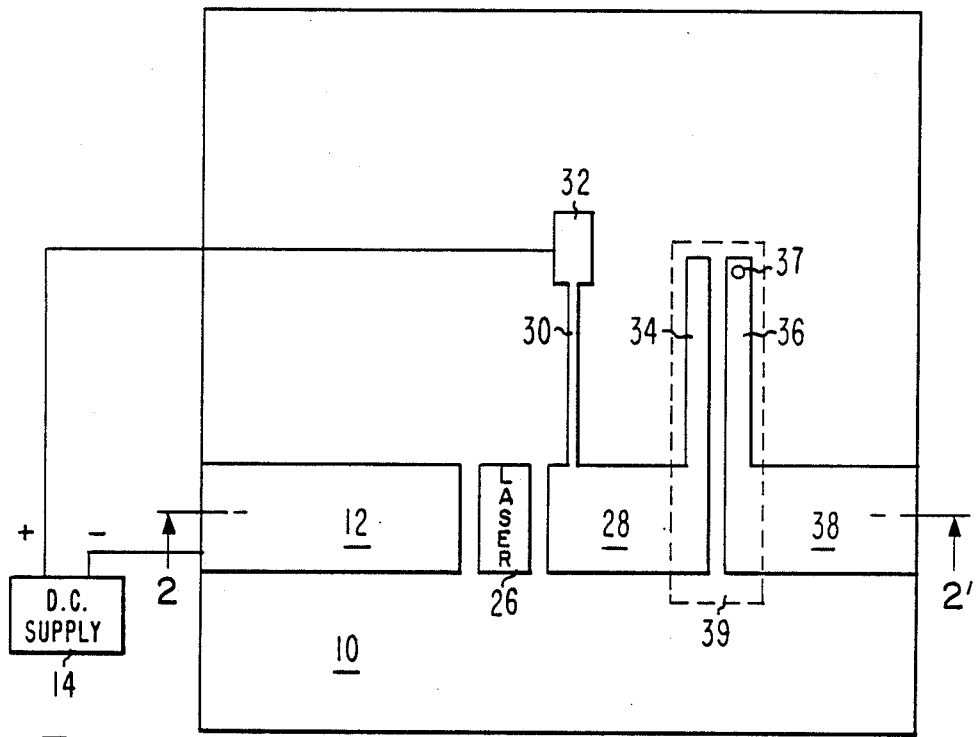
FIG. 1 is a top view of the invention.
Figure 2A:
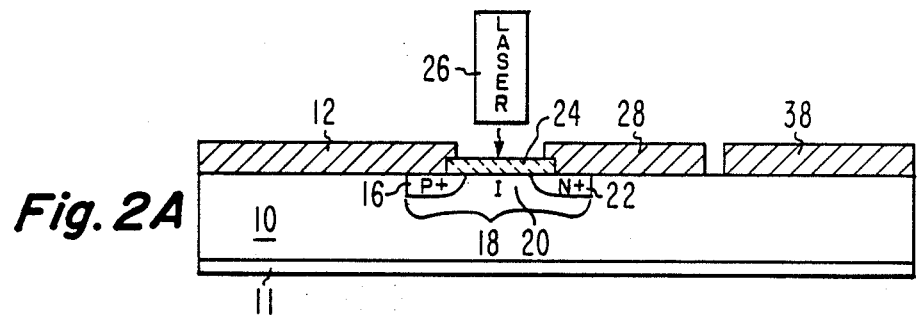
FIGS. 2A and 2B are cross-sectional views taken along the line 2—2' of FIG. 1 of first and second embodiments of the invention, respectively.

As shown in FIGS. 1 and 2A, the first embodiment comprises an intrinsic substrate 10 overlying a ground plane conductor 11 and having thereon a first conductor 12. The conductor 12 has one end coupled to the negative terminal of a D.C. supply 14 of up to about 1000 volts and capable of providing, e.g., 20 amperes and another end coupled to a P+ conductivity type electrode region 16 of a monolithic lateral PIN diode 18. The diode 18 additionally comprises an intrinsic (I) conductivity type region 20 adjacent the region 16, an N+ conductivity type electrode region 22 adjacent the region 20, and an insulating layer 24 overlying the I region 20 and portions of the electrode regions 16 and 22. A laser 26 is disposed over the I-region 20 for illumination thereof. Obviously, the laser 26 could be remotely disposed and optically coupled to the I-region 20 by means of an optical fiber (not shown) if so desired.

A second conductor 28 overlies the substrate 10 and has one end coupled to the region 22. The conductor 28 has an extension 30 that is electrically one quarter wavelength long at the frequency of interest in order to act as a radio frequency choke. A terminal pad 32 lies at the end of the extension 30 and is coupled to the positive terminal of the supply 14. It will be appreciated that the diode 18 is thereby reversed biased. A bar 34 extends parallel to and spaced from a bar 36 of a third conductor 38. Optionally, a conducting via hole 37 is disposed at the end of the bar 36 to connect it to the ground plane 11. The conductors 12, 28 and 38, including the extensions 34 and 36, form microstrip transmission lines with the ground plane 11 having a characteristic impedance of 50 ohms. The bars 34 and 36 also comprise a monolithic resonator and impedance transformer 39 having an electrical length between about one-eighth to one-quarter wavelength at the frequency of interest. The transformer converts the impedance of the diode 18, to 50 ohms to match the characteristic impedance of the microstrip conductor 38. Such transformers are disclosed in the article "Silicon Avalanche-Diode Microstrip L-Band Oscillator," by A. Rosen et al., I.E.E.E. Trans. on Microwave Theory and Techniques, Vol. MTT-18, pp. 979-981. Briefly, the bars 34 and 36 act as coupled TEM mode transmission lines. Their width is about 89 $\mu$m (micrometer) and their inner edge-to-inner edge spacing is 25 $\mu$m for a selected frequency of 6 GHz. The via hole 37 causes the resonator 39 to provide an impedance match over a broader bandwidth. The output signal is provided at the right hand end of the conductor 38, which can be fitted with a type OSM connector (not shown) or the conductor 38 can just be extended to combine with other devices in accordance with the invention to obtain greater power output.

The conductors or conducting layers 11, 12, 28 and 38 including elements 30, 32, 34 and 36, can comprise a compound layer of a Cr layer with a thickness between about 400–1000 Angstroms and a Au layer with a thickness of about 1 $\mu$m with the Cr layer next to the substrate 10. The substrate 10 has a thickness of about 6 to 7 mils (152 to 177 $\mu$m) and can comprise any semiconductor, e.g., Si or Ge, or group III-V semi-insulator, e.g., GaAs, InP, but Si is preferred since it has a long carrier lifetime, thereby minimizing the duty cycle, and thus, the heating of the laser 26. The insulating layer 24 can comprise any insulator such as $SiO_2$ or $Si_3N_4$. The regions 16 and 22 can be doped with B and P, respectively, with a doping level of about $10^{19}$ cm$^{-3}$. As known in the art, the I-region 20 is actually a weakly doped P or N conductivity type region since it is very difficult to obtain a region that is exactly intrinsic. It is preferred to use a weakly doped N-conductivity for the region 20 with a doping level between about $10^{12}$ to $10^{14}$ cm$^{-3}$ and a resistivity of about 4000 ohm-cm since a weakly doped P-conductivity type region can change to a weakly doped N-conductivity type at high temperatures, thereby changing the electrical characteristics of the diode 18. The laser 24 must provide light having a minimum frequency depending upon the material of the substrate 10 in order to have enough energy to generate photocarriers so that the ON resistance of the diode 18 is low for maximum efficiency. With a substrate 10 of Si, a CW mode locked Nd:YAG laser frequency doubled to provide green light of 532 nm (nanometers) wavelength was satisfactory. In particular, such a laser has picosecond rise times so that millimeter wave harmonics are generated.

In operation, the laser 26 is initially OFF, and thus the reversed biased diode 18 is also OFF (non-conducting). When the laser 26 is turned ON, the light that is emitted generates photocarriers in the I-region 20, thereby turning ON the diode 18. Current is then drawn from the source 14, which has a high harmonic content due to the steepness of the light pulse. The desired harmonic is then selected by the monolithic resonator 39 and also impedance transformed thereby. The laser 26 is then turned OFF. Thereafter the cycle is repeated. It has been found that a cycle period of about 10 ns (nanoseconds) provides a nearly CW output signal for a substrate 10 of Si. An efficiency of about 1% was obtained.

It will be appreciated that the use of the PIN diode 18, which is reversed biased when OFF, instead of bulk Si as the optical switch, prevents currents from flowing in the substrate 10 between a plurality of DC to RF converters as described above and affecting their timing.

A possible problem with the above described embodiment is that the OFF resistance of the Si substrate 10 may not be high enough to obtain a desired high Q for the resonator 39. One can use GaAs for the substrate 10 to obtain a high value of Q due to its high OFF resistance, but since GaAs has a shorter carrier lifetime than Si, a higher pulse repetition rate is then required of the laser 26, which might result in excessive heat dissipation thereof.

Figure 2B:
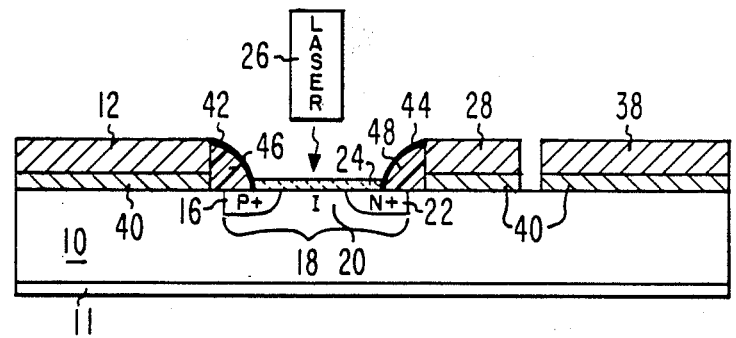

FIG. 2B shows a second embodiment for obtaining the best characteristics of both materials, wherein corresponding elements have corresponding reference numerals. This embodiment features a semi-insulating layer 40 of about 3 μm thickness, made of, e.g., a group III-V material such as GaAs, InP, etc., which can be deposited on the substrate 10 by molecular beam epitaxy or metalorganic chemical vapor deposition as disclosed in the article "Organometallic Chemical Vapor Deposition of GaAs and AlGaAs for Microwave Applications," R. J. Menna et al., RCA Review, December 1986, Vol. 47, No. 4, pp. 578-617. The layer 40 acts as the substrate for the conductors 12, 28, and 38, and therefore, the resonator 39. The diode 18 is still preferrably fabricated in a Si substrate 10. First and second conducting bridges 42 and 44 such as Ag, Al, Cu, etc., preferably Au, connect the layer 12 to the region 16 and connect the layer 28 to the region 22, respectively. First and second insulating filets 46 and 48 (such as a polyimide or an oxide) are disposed underneath the bridges 42 and 44, respectively, and overlie the substrate 10 and prevent the bridges from contacting the intrinsic portions of the substrate 10. The filets 46 and 48 can be eliminated and the bridges 42 and 44 can then be air bridges. If the doped regions 16 and 22 are near the edges of the layer 40, then a continuation of the layers 12 and 28 to these regions, respectively, can be used as the bridges 42 and 44 without the filets 46 and 48.

It will be appreciated that since GaAs has a lower dielectric loss than Si, the microstrip transmission lines formed by the conductors 12, 28, and 38, including the resonator 39, have a higher Q than the embodiment of FIG. 1 while the diode 18 has as long a carrier lifetime as the embodiment of FIG. 1 since the substrate 10 is still Si.

The embodiment of FIG. 2B has a calculated efficiency of about 10%.

What is claimed is:

1. A device for converting voltage from a DC supply to RF comprising:
   a monolithic resonator; and
   a monolithic lateral PIN diode optical switch means having a pair of opposite conductivity type regions adapted to be coupled to the DC supply, one of said regions coupled to said resonator, and an intrinsic region adapted to receive an optical switching signal.

2. A device as claimed in claim 1 wherein said opposite conductivity type regions are P and N regions respectively, said P region being adapted to be coupled to a negative terminal of said supply, the N region being adapted to be coupled to a positive terminal of the supply.

3. A device as claimed in claim 1 further comprising a common substrate for said resonator and said diode.

4. A device as claimed in claim 1 wherein said substrate comprises a semiconductor.

5. A device as claimed in claim 4 wherein said semiconductor substrate comprises silicon.

6. A device as claimed in claim 3 wherein said substrate comprises a semi-insulator.

7. A device as claimed in claim 1 wherein said diode and said resonator each comprise a substrate of materials different from each other.

8. A device as claimed in claim 7 wherein said resonator substrate overlies said diode substrate.

9. A device as claimed in claim 8 further comprising first, second, and third conductors overlying said resonator substrate; first and second conducting bridges coupled between said first and second conductors, respectively, and the P and N conductivity type regions, respectively, of said PIN diode.

10. A device as claimed in claim 9, further comprising first and second insulating filets disposed between said first and second conducting bridges, respectively, and said diode substrate.

11. A device as claimed in claim 7 wherein said resonator substrate is a semi-insulator and said diode substrate is a semiconductor.

12. A device as claimed in claim 11 wherein said semi-insulator is GaAs and said semiconductor is Si.

13. A device as claimed in claim 1 wherein said resonator also comprises an impedance transformer.

14. A device as claimed in claim 1 wherein said resonator comprises a pair of coupled microstrip transmission lines.

15. A device as claimed in claim 14 wherein one of said lines is coupled to said diode.

16. A device as claimed in claim 15, further comprising a ground plane conductor coupled to an end of the remaining line.

17. A device as claimed in claim 14 wherein said lines also comprise an impedance transformer.

18. A device as claimed in claim 1, further comprising a laser optically coupled to the I conductivity type region of said PIN diode.

* * * * *